United States Patent
Lee et al.

(10) Patent No.: US 12,183,411 B2
(45) Date of Patent: Dec. 31, 2024

(54) MEMORY INTERFACE CIRCUITRY AND BUILT-IN SELF-TESTING METHOD

(71) Applicant: Integrated Silicon Solution Inc., Milpitas, CA (US)

(72) Inventors: Hyeon Jae Lee, Milpitas, CA (US); Jeong Ho Bang, Milpitas, CA (US); Wol Jin Lee, Milpitas, CA (US); Ki Hyung Ryoo, Milpitas, CA (US); Kwang Rae Cho, Milpitas, CA (US); Sun Byeong Yoon, Milpitas, CA (US)

(73) Assignee: INTEGRATED SILICON SOLUTION INC., Milpitas, CA (US)

( * ) Notice: Subject to any disclaimer, the term of this patent is extended or adjusted under 35 U.S.C. 154(b) by 193 days.

(21) Appl. No.: 18/168,628

(22) Filed: Feb. 14, 2023

(65) Prior Publication Data

US 2024/0274214 A1    Aug. 15, 2024

(51) Int. Cl.
*G11C 7/10* (2006.01)
*G11C 29/12* (2006.01)
*G11C 29/36* (2006.01)

(52) U.S. Cl.
CPC .... *G11C 29/12015* (2013.01); *G11C 29/1201* (2013.01); *G11C 29/36* (2013.01); *G11C 2029/3602* (2013.01)

(58) Field of Classification Search
CPC .................................................. G11C 7/1084
See application file for complete search history.

(56) References Cited

U.S. PATENT DOCUMENTS 10,861,508 B1 * 12/2020 Mathur ................ G11C 7/1084

* cited by examiner

*Primary Examiner* — Jason Lappas
(74) *Attorney, Agent, or Firm* — McClure, Qualey & Rodack, LLP (57) ABSTRACT

A memory interface circuitry includes a clock generator to convert the first clock signal into a second clock signal, a state machine to generate a test signal according to the second clock signal, a data pattern generator to generate a plurality of pre-defined data, a read register to sequentially output the plurality of pre-defined data, an I/O interface to capture a plurality of data from the plurality of pre-defined data according to a write strobe signal, a write register to receive and store the plurality of data from the I/O interface, and a comparator to compare the plurality of pre-defined data with the plurality of data to generate a test result. The test result is configured to verify an operation of the I/O interface.

16 Claims, 9 Drawing Sheets

MEMORY INTERFACE CIRCUITRY AND BUILT-IN SELF-TESTING METHOD

BACKGROUND

Technical Field

The present disclosure relates to a memory interface technology. More particularly, the present disclosure relates to a memory interface circuitry with built-in self-test and a built-in self-testing method.

Description of Related Art

In recent years, memory can be assembled into various electronic products, such as Double Data Rate (DDR) Synchronous Dynamic Random Access Memory (SDRAM) is one of Dynamic Random Access Memory (DRAM), which can support DDR. With the advancement of technology, DDR SDRAM has developed into DDR2, DDR3, DDR4 and DDR5, and even higher data rate in the near future. In response to the improvement of operating frequencies of memory devices, the test equipment needs a higher test speed to test the corresponding memory. However, the operating frequencies of the memory devices are increasing and sometimes exceed the test pattern frequency generated by the test equipment, thereby making the test equipment ineffective.

In addition, due to the continuous shrinking of memory circuits, the cost of external test or evaluation equipment has skyrocketed inexorably. Greater numbers of interface nodes, higher operating frequencies, and specialized test arrangements such as multi-chip modules all contribute to soaring test costs.

In view of this, there is currently a lack of a circuit and a method for the full speed IO testing of semiconductor memory chips for low-cost and low-resource automatic test equipment, so the relevant industry is looking for its solution.

SUMMARY

According to one aspect of the present disclosure, a memory interface circuitry includes a clock generator, a state machine, a data pattern generator, a read register, an input/output (I/O) interface, a write register and a comparator. The clock generator receives a first clock signal and converts the first clock signal into a second clock signal. The state machine is coupled to the clock generator and generates a test signal according to the second clock signal. The data pattern generator is coupled to the state machine and generates a data pattern according to the test signal, and the data pattern includes a plurality of pre-defined data. The read register is coupled to the data pattern generator and receives the plurality of pre-defined data from the data pattern generator, and the read register sequentially outputs the plurality of pre-defined data. The I/O interface is coupled to the read register and receives the plurality of pre-defined data from the read register. The I/O interface includes an I/O buffer, and the I/O buffer captures a plurality of data from the plurality of pre-defined data according to a write strobe signal. The write register is coupled to the I/O interface, and the write register receives and stores the plurality of data from the I/O interface. The comparator is coupled to the data pattern generator and the write register, the comparator compares the plurality of pre-defined data with the plurality of data to generate a test result, and the test result is configured to verify an operation of the I/O interface.

According to another aspect of the present disclosure, a built-in self-testing method is for a memory interface circuitry. The memory interface circuitry includes a clock generator, a state machine, a data pattern generator, a read register, an input/output (I/O) interface, a write register and a comparator. The built-in self-testing method includes performing a clock signal converting step, a test signal generating step, a data pattern generating step, a data transferring step, a data capturing step and a data comparing step. The clock signal converting step includes configuring the clock generator to receive a first clock signal and convert the first clock signal into a second clock signal. The test signal generating step includes configuring the state machine to generate a test signal according to the second clock signal. The data pattern generating step includes configuring the data pattern generator to generate a data pattern according to the test signal. The data pattern includes a plurality of pre-defined data. The data transferring step includes configuring the read register to receive the plurality of pre-defined data from the data pattern generator and sequentially output the plurality of pre-defined data to the I/O interface. The I/O interface includes an I/O buffer. The data capturing step includes configuring the I/O buffer to capture a plurality of data from the plurality of pre-defined data according to a write strobe signal, and then to store the plurality of data in the write register. The data comparing step includes configuring the comparator to compare the plurality of pre-defined data with the plurality of data to generate a test result. The test result is configured to verify an operation of the I/O interface.

According to one another aspect of the present disclosure, a memory interface circuitry includes a clock generator, a state machine, a data pattern generator, a register module, an input/output (I/O) interface and a comparator. The clock generator receives a first clock signal and converts the first clock signal into a second clock signal. The state machine is coupled to the clock generator and generates a test signal according to the second clock signal. The data pattern generator is coupled to the state machine and generates a data pattern according to the test signal, and the data pattern includes a plurality of pre-defined data. The register module is coupled to the data pattern generator, and the register module receives and stores the plurality of pre-defined data. The I/O interface is coupled to the register module and receives the plurality of pre-defined data from the register module. The I/O interface includes an I/O buffer, the I/O buffer captures a plurality of data from the plurality of pre-defined data according to a write strobe signal, and the plurality of data are stored into the register module. The comparator is coupled to the data pattern generator and the register module, the comparator compares the plurality of pre-defined data with the plurality of data to generate a test result, and the test result is configured to verify an operation of the I/O interface.

BRIEF DESCRIPTION OF THE DRAWINGS

The present disclosure can be more fully understood by reading the following detailed description of the embodiment, with reference made to the accompanying drawings as follows.

DETAILED DESCRIPTION

The embodiment will be described with the drawings. For clarity, some practical details will be described below. However, it should be noted that the present disclosure should not be limited by the practical details, that is, in some embodiment, the practical details is unnecessary. In addition, for simplifying the drawings, some conventional structures and elements will be simply illustrated, and repeated elements may be represented by the same labels.

It will be understood that when an element (or device) is referred to as be "connected to" another element, it can be directly connected to the other element, or it can be indirectly connected to the other element, that is, intervening elements may be present. In contrast, when an element is referred to as be "directly connected to" another element, there are no intervening elements present. In addition, the terms first, second, third, etc. are used herein to describe various elements or components, these elements or components should not be limited by these terms. Consequently, a first element or component discussed below could be termed a second element or component.

Figure 1:
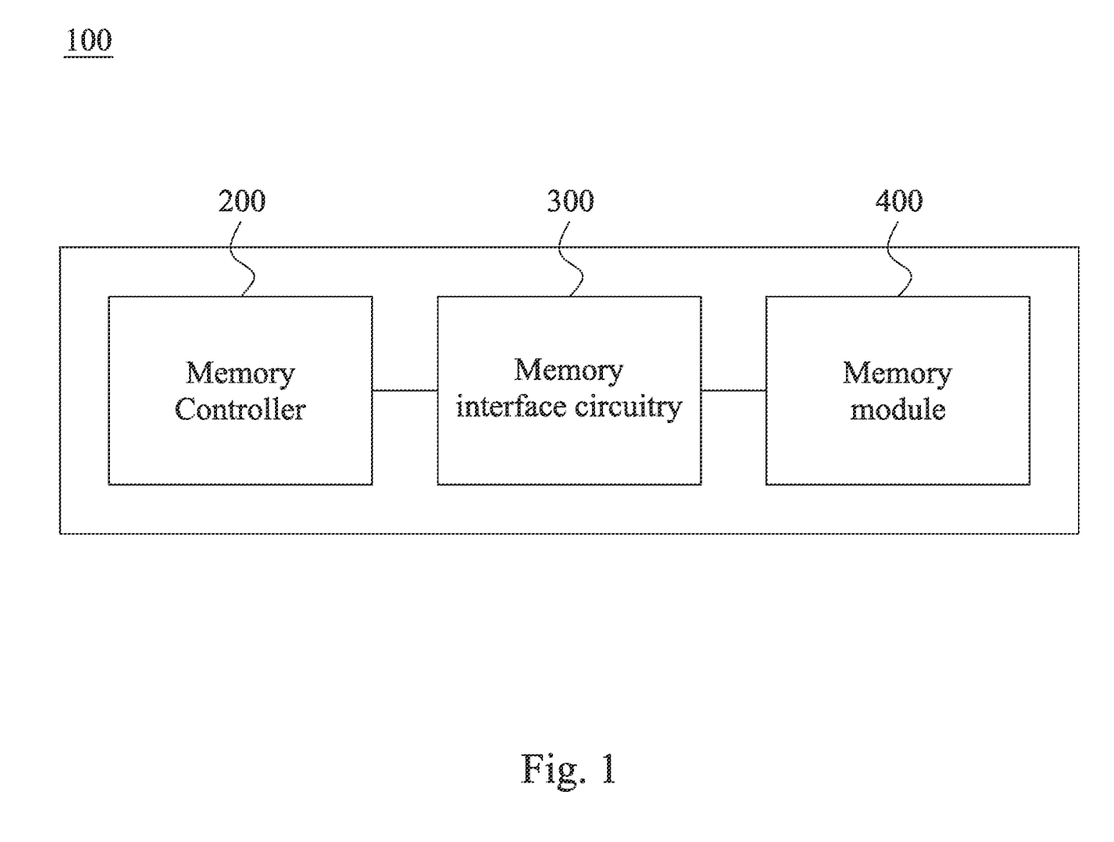
FIG. 1 shows a block diagram of a memory device according to a first embodiment of the present disclosure.
Figure 2:
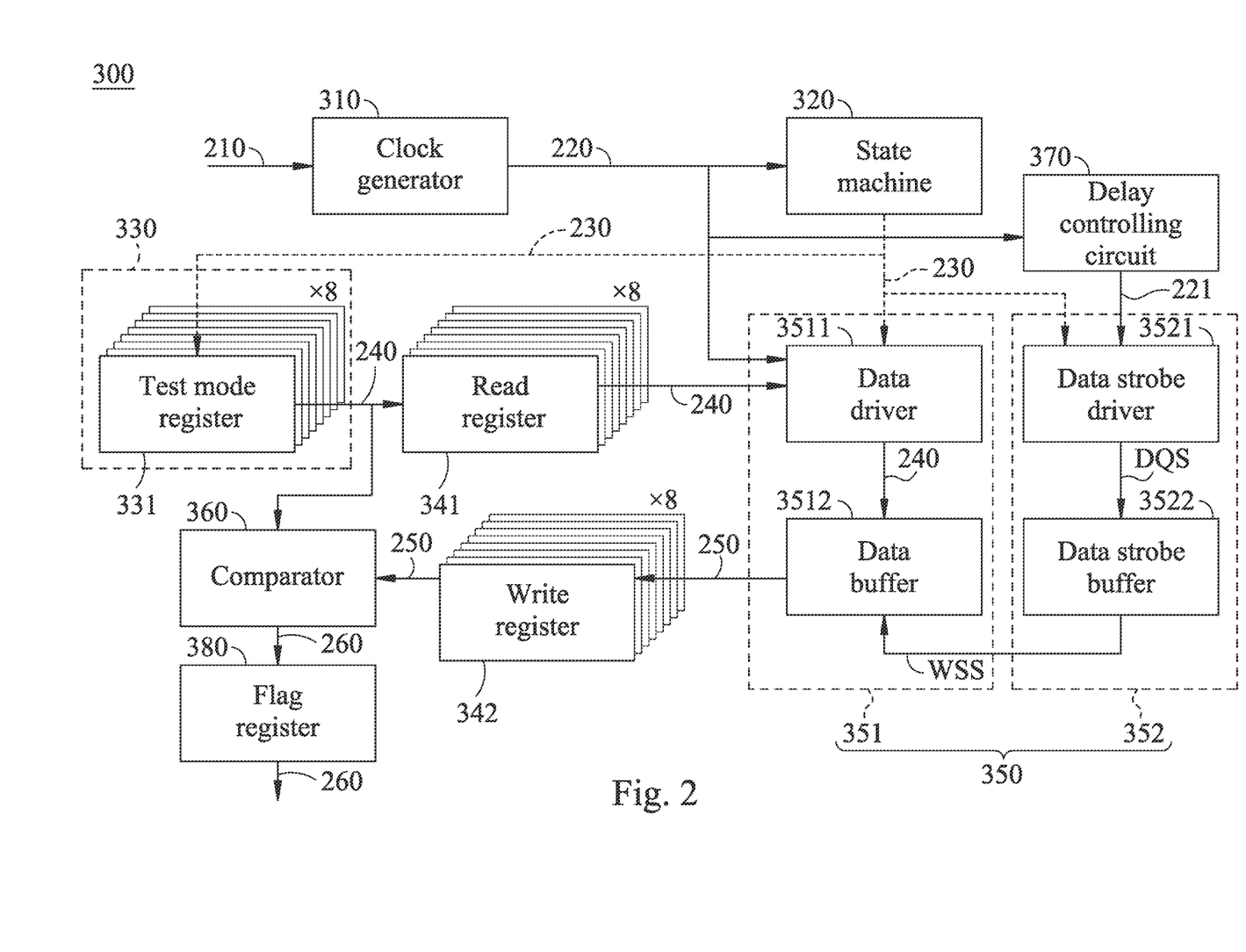
FIG. 2 shows a block diagram of a memory interface circuitry of the memory device of FIG. 1.

Please refer to FIGS. 1 and 2. FIG. 1 shows a block diagram of a memory device 100 according to a first embodiment of the present disclosure. FIG. 2 shows a block diagram of a memory interface circuitry 300 of the memory device 100 of FIG. 1. As shown in FIG. 1, the memory device 100 includes a memory controller 200, a memory interface circuitry 300 and a memory module 400. The memory interface circuitry 300 is connected between the memory controller 200 and the memory module 400. The memory controller 200 supports separate and/or parallel data access operations for the memory module 400 through the memory interface circuitry 300. The memory controller 200 can be regarded as a control chip of the memory device 100, and the memory module 400 can be regarded as a cache memory, a buffer memory or a main memory of the memory device 100. In particular, the memory controller 200 is configured to control an overall operation of the memory device 100, and can include a processing chip, such as a Central Processing Unit (CPU) or a microprocessor. The memory module 400 can include various types of volatile memories including a DDR SDRAM, a DDR2 SDRAM, a DDR3 SDRAM, a DDR4 SDRAM and a DDR5 SDRAM, but the present disclosure is not limited thereto. The memory interface circuitry 300 is configured to connect the memory controller 200 to the memory module 400. When the memory controller 200 intends to read data from the memory module 400 or store data into the memory module 400, the memory controller 200 can send a control command/signal to the memory module 400 through the memory interface circuitry 300. When the control command/signal is received by the memory module 400, the memory module 400 stores a write data or returns a read data to the memory controller 200 through the memory interface circuitry 300 according to the control command/signal.

As shown in FIG. 2, the memory interface circuitry 300 includes a clock generator 310, a state machine 320, a data pattern generator 330, a read register 341, an input/output (I/O) interface 350, a write register 342 and a comparator 360. The clock generator 310 receives a first clock signal 210, which is generated by the memory controller 200. The clock generator 310 converts the first clock signal 210 into a second clock signal 220, and a first clock frequency of the first clock signal 210 is lower than a second clock frequency of the second clock signal 220. The state machine 320 is coupled to the clock generator 310 and generates a test signal 230 according to the second clock signal 220. The data pattern generator 330 is coupled to the state machine 320 and generates a data pattern according to the test signal 230, and the data pattern includes a plurality of pre-defined data 240. The read register 341 is coupled to the data pattern generator 330 and receives the plurality of pre-defined data 240 from the data pattern generator 330, and the read register 341 sequentially outputs the plurality of pre-defined data 240.

The I/O interface 350 is coupled to the read register 341 and receives the plurality of pre-defined data 240 from the read register 341. The I/O interface includes an I/O buffer 351, and the I/O buffer 351 captures a plurality of data 250 from the plurality of pre-defined data 240 according to a write strobe signal WSS. The write register 342 is coupled to the I/O interface 350, and the write register 342 receives and stores the plurality of data 250 from the I/O interface 350. The comparator 360 is coupled to the data pattern generator 330 and the write register 342, and compares the plurality of pre-defined data 240 with the plurality of data 250 to generate a test result 260, and the test result 260 is configured to verify an operation of the I/O interface 350.

Therefore, the memory interface circuitry 300 of the present disclosure can conduct loopback Built-In Self-Test (BIST) for testing the I/O interface 350 at higher speed without using external test or evaluation equipment. In other words, the state machine 320 and the I/O interface 350 operate by using a high-speed clock (i.e., the second clock signal 220), but a command path connected between the memory controller 200 and the memory interface circuitry 300 operates by using a low speed clock (i.e., the first clock signal 210). Thus, the first clock signal 210 generated by the memory controller 200 is a command signal that can be input without restrictions even during BIST mode operation, making it easy to perform BIST-related test mode or operation adjustments.

Figure 3:
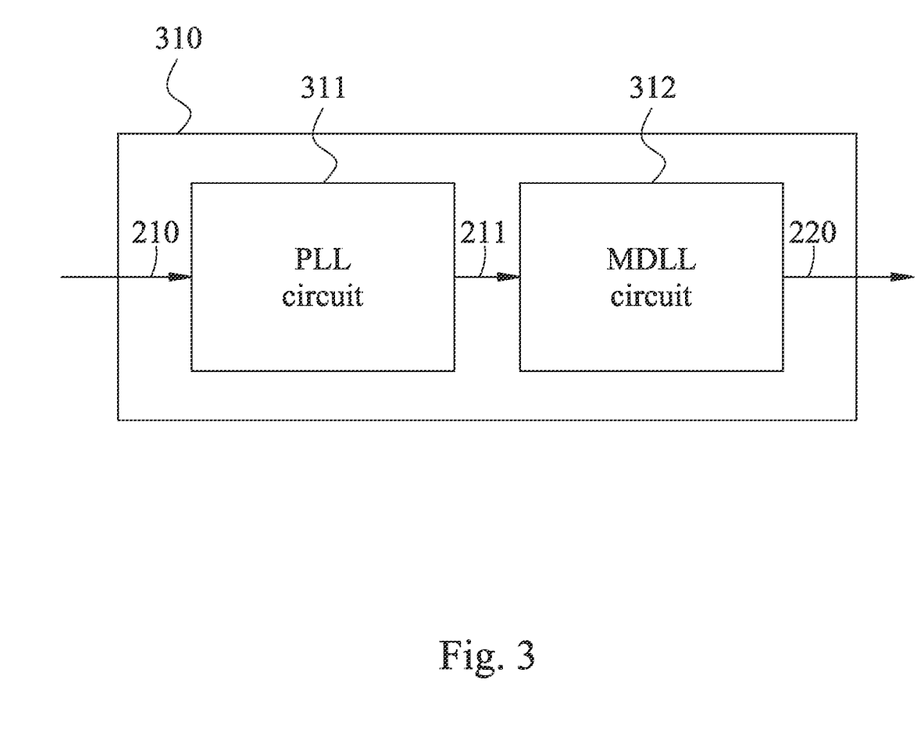
FIG. 3 shows a block diagram of a clock generator of the memory interface circuitry of FIG. 2.

Please refer to FIGS. 2 and 3. FIG. 3 shows a block diagram of the clock generator 310 of the memory interface circuitry 300 of FIG. 2. As shown in FIG. 3, the clock generator 310 includes a Phase-Locked Loop (PLL) circuit 311 and a Multiplying Delay-Locked Loop (MDLL) circuit 312. The PLL circuit 311 receives the first clock signal 210 and filters the first clock signal 210 to output a reference clock signal 211, which can be a zero-phase clock signal. The MDLL circuit 312 is coupled to the PLL circuit 311 and converts the reference clock signal 211 into the second clock signal 220. In detail, the PLL circuit 311 receives the first clock signal 210, which can be a tester clock generated from a tester or the memory controller 200, and eliminates the jitter and the noise from the tester or the memory controller

200. Using the output of the PLL circuit 311, the MDLL circuit 312 generates the second clock signal 220, and the second clock signal 220 with high-frequency can be used for the BIST I/O test. The combination of the PLL circuit 311 having the low bandwidth and the MDLL circuit 312 makes the memory interface circuitry 300 easy to be applied to electronic products that require high-speed memory, and improves the quality of high-speed clock at the same time. Thus, the memory interface circuitry 300 of the present disclosure can improve the reliability of the existing I/O looping tester for high-frequency. In the DRAM process, the size of the circuitry can be greatly reduced because the cell capacity can be used.

The state machine 320 can be a finite state machine (finite state machine), which at least includes an idle state, a filling state, an active state and a test mode. The filling state represents that the memory controller 200 controls the I/O interface 350 of the memory interface circuitry 300 to store the data output by the memory module 400. The active state represents that the memory controller 200 controls the I/O interface 350 to output the stored data. The idle state represents that the I/O interface 350 does not store data or output data. The test mode represents that the memory controller 200 perform BIST on the memory interface circuitry 300, and state machine 320 generates the test signal 230 according to the second clock signal 220.

The data pattern generator 330 can include a plurality of test mode registers 331. The test mode registers 331 are configured to set the plurality of pre-defined data 240 of the data pattern, respectively. The memory interface circuitry 300 can further include a plurality of the read registers 341 for storing the plurality of pre-defined data 240, and a plurality of the write registers 342 for storing the plurality of data 250 from the I/O interface 350, and the present disclosure is not limited to the numbers of the test mode registers 331, the read registers 341 and the write registers 342.

Figure 4:
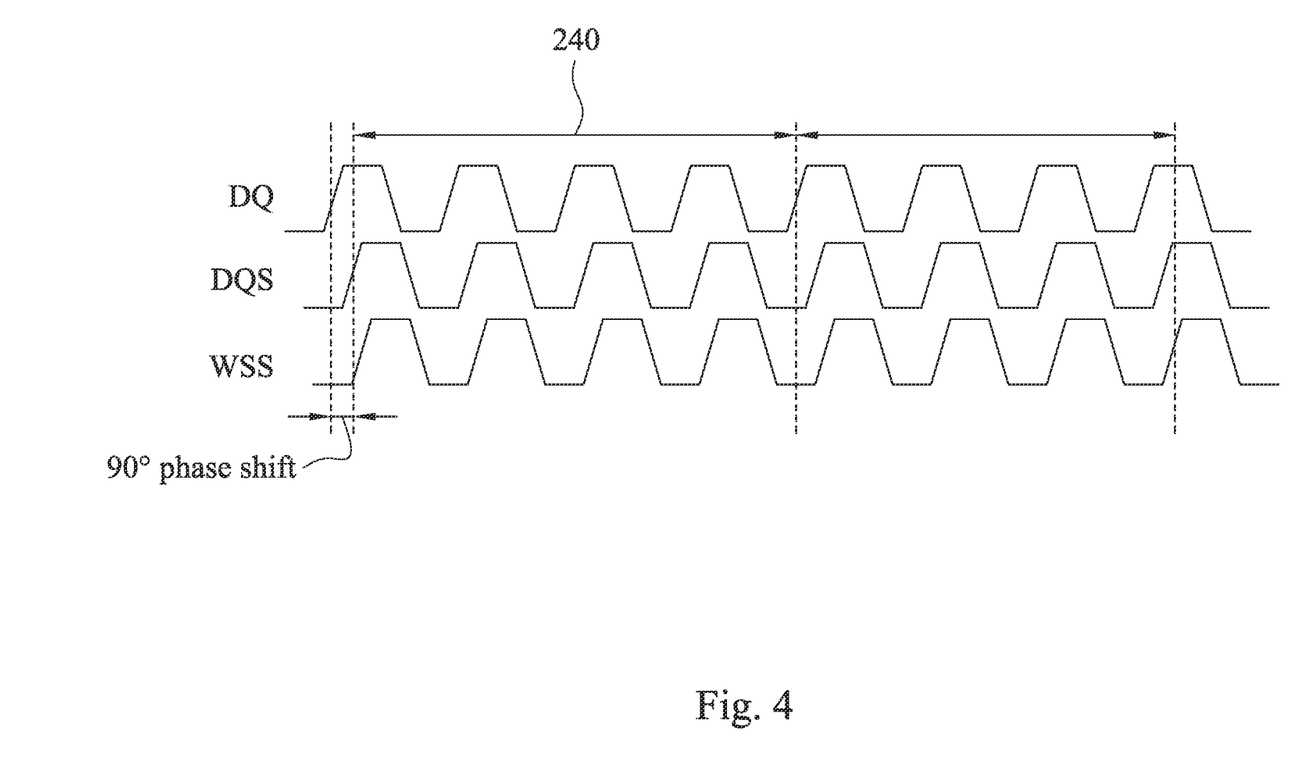
FIG. 4 is a timing diagram of signals in the memory interface circuitry of FIG. 2.

Please refer to FIGS. 2 and 4. FIG. 4 is a timing diagram of signals in the memory interface circuitry 300 of FIG. 2. In FIG. 2, the memory interface circuitry 300 can further include a delay controlling circuit 370. The delay controlling circuit 370 is coupled to the clock generator 310 and receives the second clock signal 220. The delay controlling circuit 370 generates a third clock signal 221 according to the second clock signal 220. The I/O interface 350 is coupled to the state machine 320 and processes the test signal 230 generated by the state machine 320.

In specific, the I/O buffer 351 can include a data driver 3511 and a data buffer 3512. The data driver 3511 is connected to the data buffer 3512. The I/O interface 350 can further include a strobe buffer 352, the strobe buffer 352 can include a data strobe driver 3521 and a data strobe buffer 3522, and the data strobe driver 3521 is connected to the data strobe buffer 3522. The data driver 3511 and the data strobe driver 3521 are coupled to the state machine 320 and receive the test signal 230. The state machine 320 controls the internal read operations of the data driver 3511 and the data strobe driver 3521, and the internal write operations of the data buffer 3512 and the data strobe buffer 3522 through the test signal 230. The plurality of pre-defined data 240 stored in the plurality of read registers 341 are synchronized by the second clock signal 220 in the data driver 3511, and the data driver 3511 outputs the plurality of pre-defined data 240 having synchronized. In detail, the state machine 320 turns on the data driver 3511 to perform the internal read operation, and the data driver 3511 outputs the plurality of pre-defined data 240. The state machine 320 turns on the data strobe driver 3521 to perform the internal read operation, and the data strobe driver 3521 outputs a data strobe signal DQS. The state machine 320 turns on the data buffer 3512 to perform the internal write operation. The state machine 320 turns on the data strobe buffer 3522 to perform the internal write operation to act as a write strobe signal (i.e., the write strobe signal WSS).

The data strobe driver 3521 of the strobe buffer 352 is coupled to the delay controlling circuit 370 and receives the third clock signal 221 generated by the delay controlling circuit 370. The delay controlling circuit 370 uses the third clock signal 221 to make the data strobe signal DQS to be the write strobe signal WSS by delaying the data strobe signal DQS (as shown in FIG. 4). In other words, the write strobe signal WSS is the data strobe signal DQS having delayed, and serves to capture the plurality of data 250 of the data buffer 3512 through the data strobe buffer 3522. The data strobe buffer 3522 of the strobe buffer 352 is coupled to the data buffer 3512 of the I/O buffer 351, and transfers the write strobe signal WSS to the data buffer 3512. The data driver 3511 outputs the plurality of pre-defined data 240 to the data buffer 3512. Inside the data buffer 3512, the data buffer 3512 captures the plurality of data 250 from the plurality of pre-defined data 240 according to the write strobe signal WSS, and the plurality of data 250 is loop back to the write register 342 through the data buffer 3512.

In detail, the data strobe signal DQS can be used as the write strobe signal WSS to transfer data into the memory module 400, that is, the data strobe signal DQS can be operated like the write strobe signal WSS by applying a delay option from the delay controlling circuit 370, and the operations of 8-bits data read out and 8-bits write in are repeated until BIST off. Basically, the data strobe signal DQS output from the data strobe driver 3521 is used as a read strobe signal in the memory controller 200 or a test machine. At this time, the timing of the data strobe signal DQS cannot be changed. However, since the present disclosure uses the internal write operation to determine the pass/fail of the plurality of data 250, and the timing of the data strobe signal DQS by the internal read operation can be changed. The timing of the data strobe signal DQS by the internal read operation is controlled by adjusting the second clock signal 220 in the delay controlling circuit 370.

Since the optimal delay of the data strobe signal DQS for the data strobe is different for each of frequencies. The memory interface circuitry 300 of the present disclosure has the test mode that can adjust the output delay of the data strobe signal DQS inside. The Delayed data strobe signal DQS with delay control acts as the write strobe signal WSS for capturing the plurality of data 250 during the write loop operation. The memory interface circuitry 300 of the present disclosure can prepare various delays in the test mode so as to operate for various frequencies. In addition, outputting DQ data (i.e., the plurality of data 250) is performed with high-speed clock generated from the clock generator 310, and the data strobe signal DQS can use the delayed clock at high-speed clock to make it usable as the write strobe signal WSS.

As shown in FIGS. 2 and 4, during the internal read operation, the data strobe signal DQS is edge-aligned with the plurality of data 250 (i.e., DQ data). Whereas, during the internal write operation, the data strobe signal DQS is center-aligned with the plurality of data 250 (i.e., DQ data). The present disclosure makes the internal write operation occur by reading the plurality of data 250 and the data strobe signal DQS without an input from the memory controller 200 or external test or evaluation equipment. In other words, the purpose of the present disclosure is to use the plurality of data 250 and the data strobe signal DQS output by the internal read operation from the I/O interface 350 of the memory interface circuitry 300 without the need to write the plurality of data 250 and the data strobe signal DQS from the memory controller 200 or external test or evaluation equipment. For the internal write operation to work properly, the phase difference between the plurality of data 250 (i.e., DQ data) and the data strobe signal DQS must be 90 degrees (as shown 90° phase shift in FIG. 4). To realize this, adjusting the timing of the data strobe signal DQS from the time of the internal read operation. This represents that the data strobe signal DQS is center-aligned with the plurality of data 250, is transmitted by the I/O interface 350 of the memory interface circuitry 300 from read operation.

Figure 5:
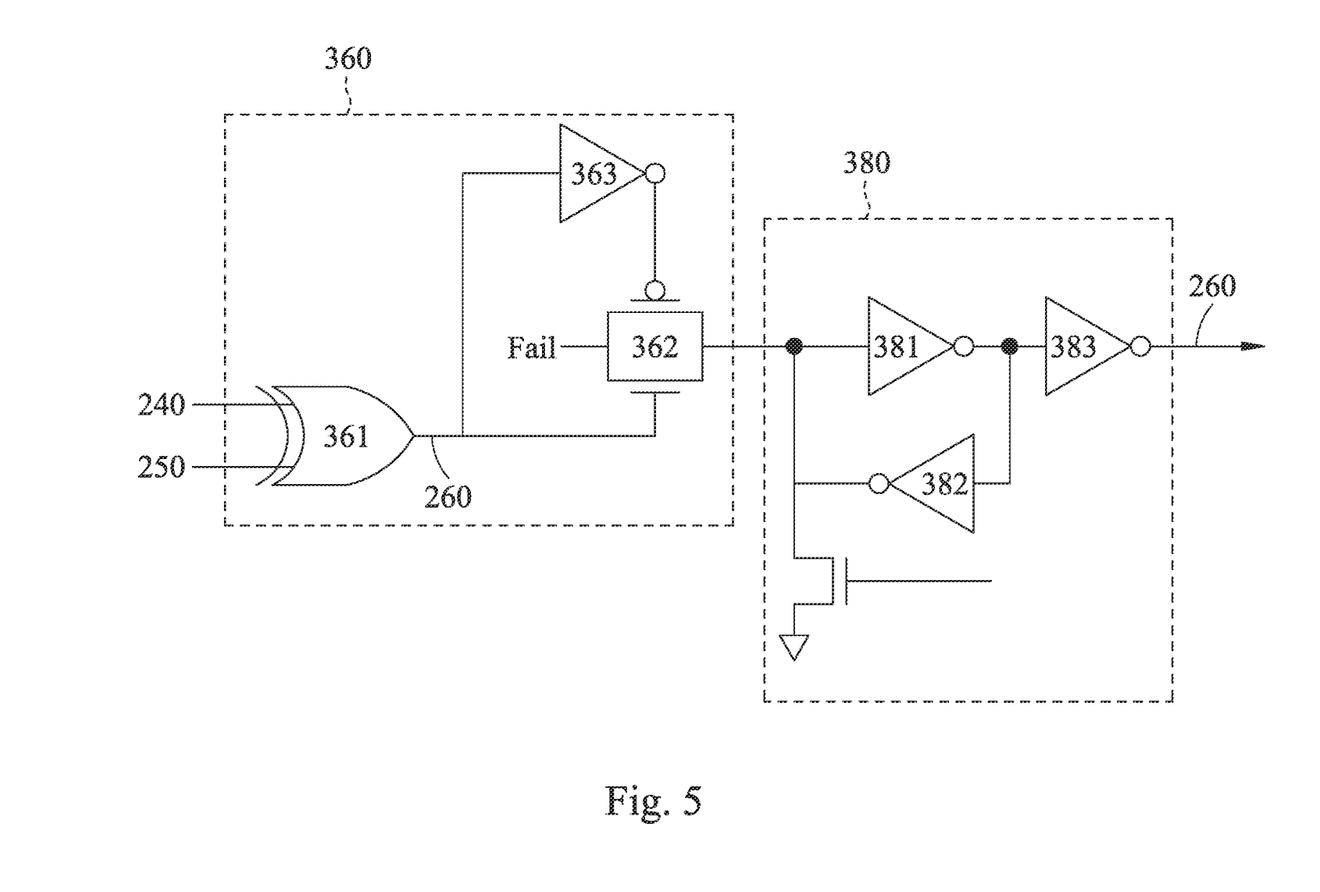
FIG. 5 shows a circuit diagram of a comparator and a flag register of the memory interface circuitry of FIG. 2.

Please refer to FIGS. 2 and 5. FIG. 5 shows a circuit diagram of the comparator 360 and a flag register 380 of the memory interface circuitry 300 of FIG. 2. The comparator 360 includes an Exclusive-OR (XOR) gate 361, a transmission gate 362 and a feedback inverters 363, which perform an XOR operation on the plurality of pre-defined data 240 generated by the data pattern generator 330 and the plurality of data 250 stored in the write register 342, and respectively compare a plurality of bits of the plurality of pre-defined data 240 with a plurality of bits of the plurality of data 250. The data read out (i.e., the plurality of pre-defined data 240) and the data looped back (i.e., the plurality of data 250) through the write operation are compared, and if the data is different, the transmission gate 362 opens and a fail flag is stored. If a fail occurs even once during the XOR operation, it is saved as a fail.

Moreover, the memory interface circuitry 300 can further include a flag register 380, and the flag register 380 is coupled to the comparator 360. The flag register 380 can include two feedback inverters 381, 382 for storing the test result 260 from the comparator 360, and an inverter 383 for outputting the test result 260, wherein the feedback inverters 381 can be a pass flag register, and the feedback inverters 382 can be a fail flag register. In response to determining that the plurality of pre-defined data 240 generated by the data pattern generator 330 is equal to the plurality of data 250 stored in the write register 342, the test result 260 is a pass flag. In response to determining that the plurality of pre-defined data 240 generated by the data pattern generator 330 is different from the plurality of data 250 stored in the write register 342, the test result 260 is a fail flag.

For example, if the bits of the plurality of pre-defined data 240 are 10101010, and the bits of the plurality of data 250 are 10101010, the test result 260 should be the pass flag, indicating that the I/O interface 350 has passed the test, that is, the operation of the I/O interface 350 is normal. If the bits of the plurality of pre-defined data 240 is 10101010 and the bits of the plurality of data 250 is 10101011, the test result 260 should be the fail flag, indicating that the I/O interface 350 has failed the test, that is, the operation of the I/O interface 350 has something errors. Thus, the memory interface circuitry 300 of the present disclosure use the comparator 360 to dynamically compare the plurality of pre-defined data 240 with the plurality of data 250 looped back and record the test result 260 into the flag register 380. The plurality of data 250 stored in the write register 342 runs the loop while repeating the pass/fail sequence by comparing it with the plurality of pre-defined data 240. If a fail occurs even once during the test mode, the test result 260 is saved as the fail flag. After the test mode is over, the test result 260 can be check, so that through the flag register 380, the present disclosure can distinguish which of eight DQ terminals (DQ 0-7) has failed.

Figure 6:
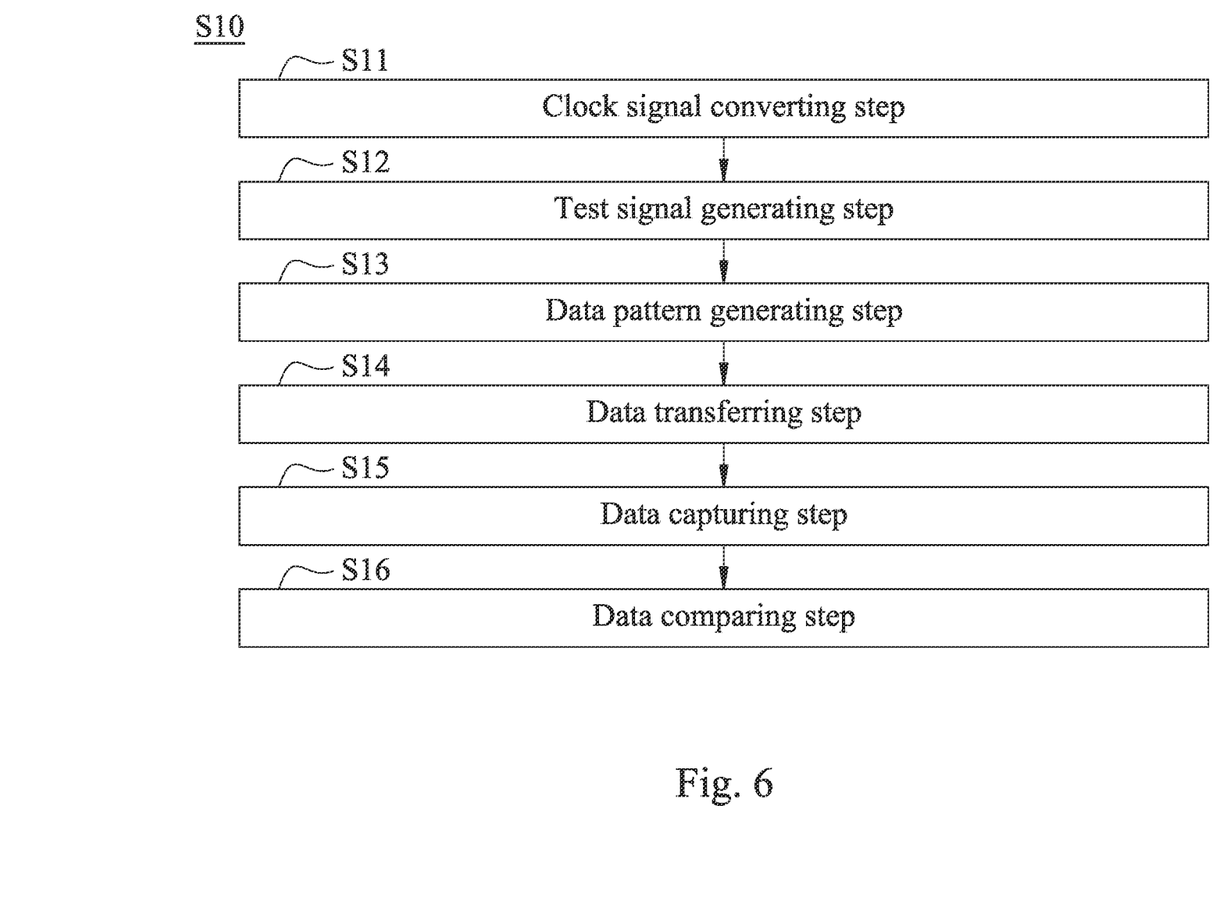
FIG. 6 shows a flow chart of a built-in self-testing method for the memory interface circuitry according to a second embodiment of the present disclosure.
Figure 7:
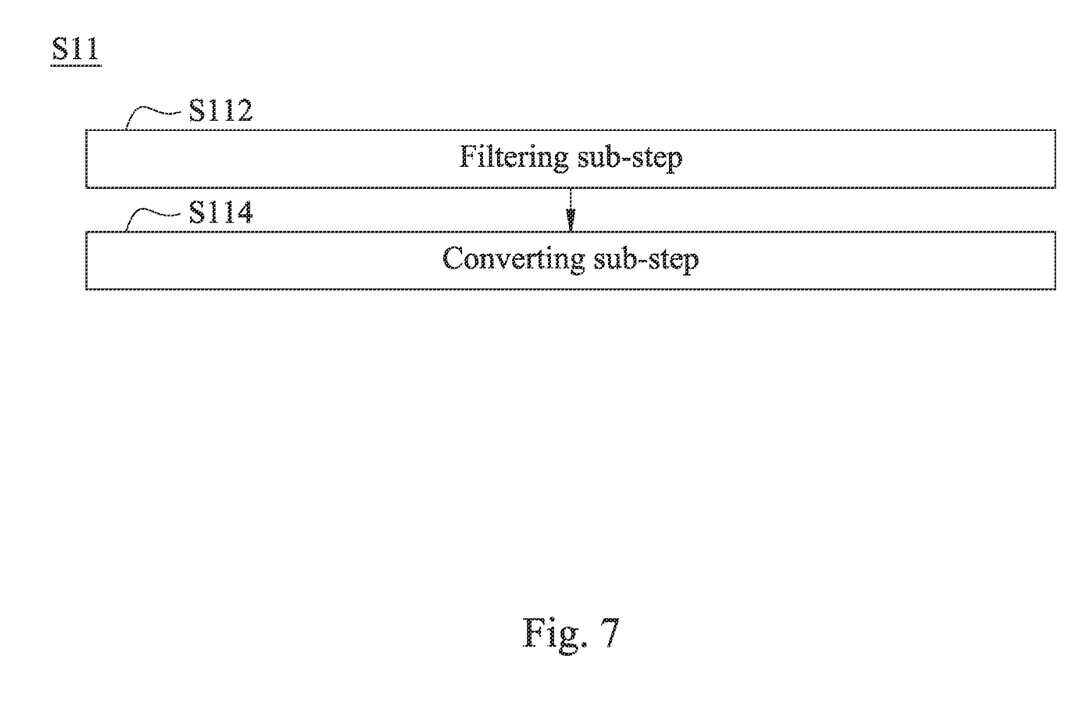
FIG. 7 shows a flow chart of a clock signal converting step of the built-in self-testing method of FIG. 6.
Figure 8:
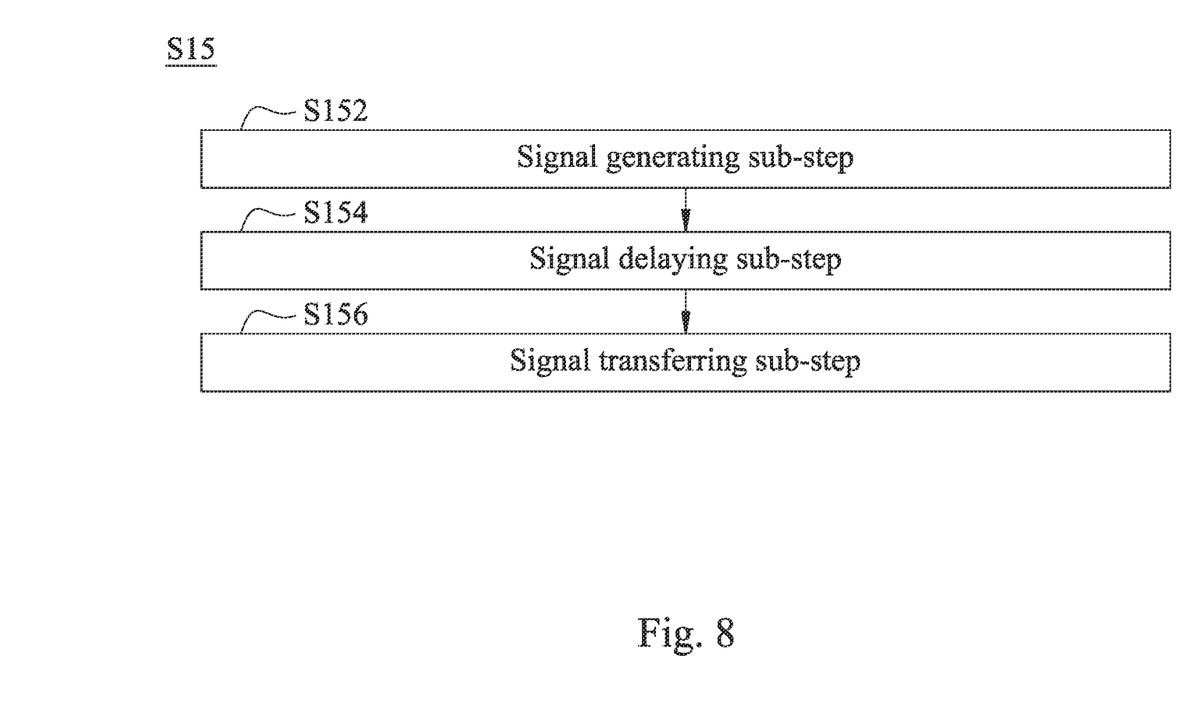
FIG. 8 shows a flow chart of a data capturing step of the built-in self-testing method of FIG. 6.

Please refer to FIGS. 2, 3, 6, 7 and 8. FIG. 6 shows a flow chart of a built-in self-testing method S10 for the memory interface circuitry 300 according to a second embodiment of the present disclosure. FIG. 7 shows a flow chart of a clock signal converting step S11 of the built-in self-testing method S10 of FIG. 6. FIG. 8 shows a flow chart of a data capturing step S15 of the built-in self-testing method S10 of FIG. 6. As shown in FIG. 6, the built-in self-testing method S10 includes performing a clock signal converting step S11, a test signal generating step S12, a data pattern generating step S13, a data transferring step S14, a data capturing step S15 and a data comparing step S16, and can be used for the memory interface circuitry 300 of FIG. 2.

The clock signal converting step S11 includes configuring the clock generator 310 to receive the first clock signal 210 and convert the first clock signal 210 into the second clock signal 220.

The test signal generating step S12 includes configuring the state machine 320 to generate the test signal 230 according to the second clock signal 220.

The data pattern generating step S13 includes configuring the data pattern generator 330 to generate a data pattern including the plurality of pre-defined data 240 according to the test signal 230.

The data transferring step S14 includes configuring the read register 341 to receive the plurality of pre-defined data 240 from the data pattern generator 330 and sequentially output the plurality of pre-defined data 240 to the I/O interface 350.

The data capturing step S15 includes configuring the I/O buffer 351 of the I/O interface 350 to capture the plurality of data 250 from the plurality of pre-defined data 240 according to the write strobe signal WSS, and then to store the plurality of data 250 in the write register 342.

The data comparing step S16 includes configuring the comparator 360 to compare the plurality of pre-defined data 240 with the plurality of data 250 to generate the test result 260. The test result 260 is configured to verify the operation of the I/O interface 350.

As shown in FIG. 7, the clock signal converting step S11 can further include performing a filtering sub-step S112 and a converting sub-step S114. The filtering sub-step S112 is performed to configure the PLL circuit 311 to filter the first clock signal 210 to output the reference clock signal 211. The converting sub-step S114 is performed to configure the MDLL circuit 312 to convert the reference clock signal 211 into the second clock signal 220.

As shown in FIG. 8, the data capturing step S15 can further include performing a signal generating sub-step S152, a signal delaying sub-step S154 and a signal transferring sub-step S156. The signal generating sub-step S152 is performed to configure the data strobe driver 3521 of the strobe buffer 352 to generate the data strobe signal DQS. The signal delaying sub-step S154 is performed to configure the delay controlling circuit 370 make the data strobe signal DQS to be the write strobe signal WSS by delaying the data strobe signal DQS. The signal transferring sub-step S156 is performed to configure the data strobe buffer 3522 of the strobe buffer 352 to transfer the write strobe signal WSS to the data buffer 3512 of the I/O buffer 351, so that the data driver 3511 can capture the plurality of data 250 from the plurality of pre-defined data 240 according to the write strobe signal WSS, and the plurality of data 250 is loop back to the write register 342 through the data buffer 3512. Therefore, the built-in self-testing method S10 of the present disclosure can conduct loopback BIST for testing the I/O interface 350 at higher speed without using external test or evaluation equipment, and verify the operation of the I/O interface 350 by using the comparator 360 to dynamically compare the plurality of pre-defined data 240 with the plurality of data 250.

Figure 9:
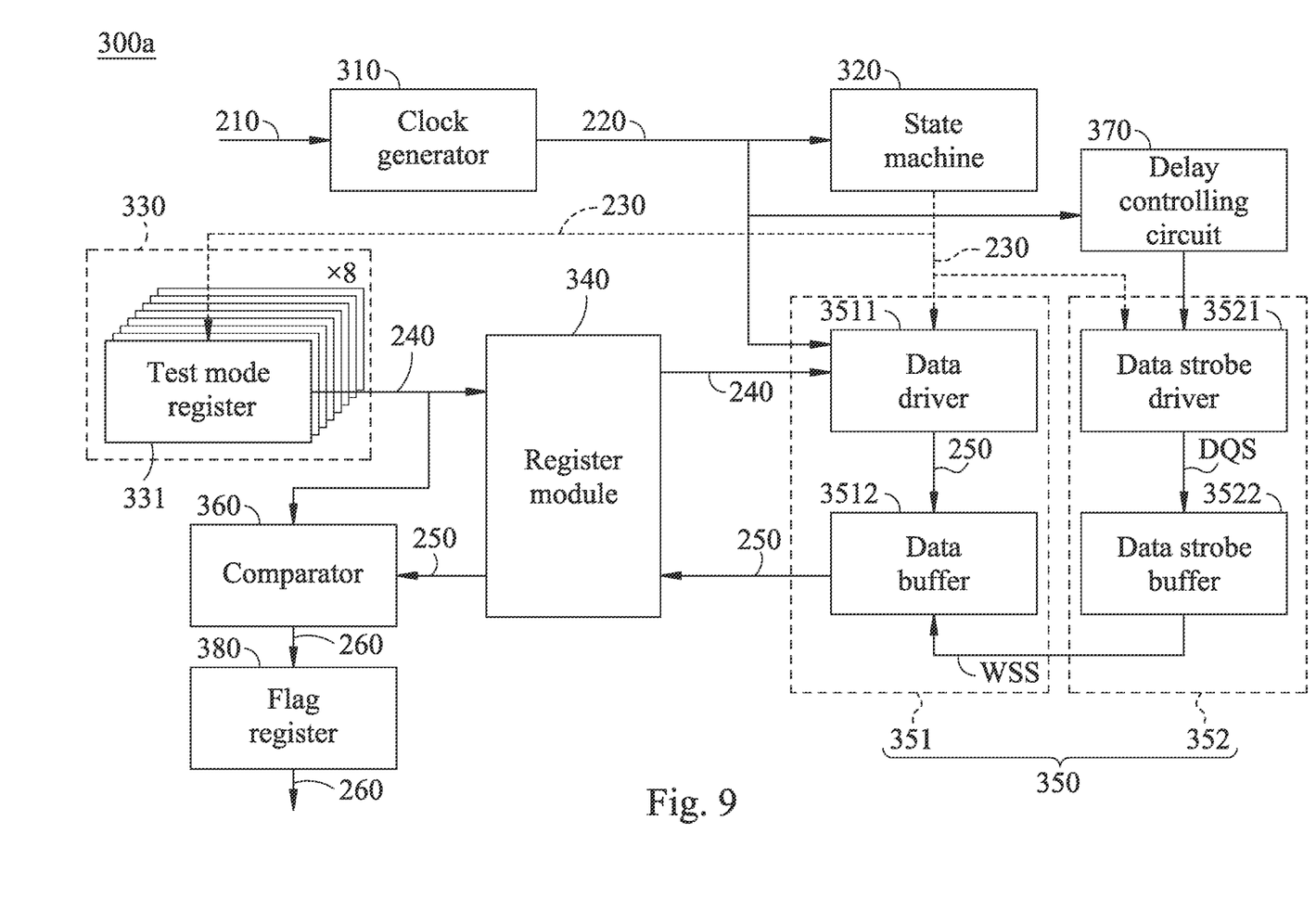
FIG. 9 shows a block diagram of a memory interface circuitry of a memory device according to a third embodiment of the present disclosure.

Please refer to FIG. 9. FIG. 9 shows a block diagram of a memory interface circuitry 300a of a memory device according to a third embodiment of the present disclosure. As shown in FIG. 9, the memory interface circuitry 300a includes the clock generator 310, the state machine 320, the data pattern generator 330, the I/O interface 350, the comparator 360, the delay controlling circuit 370 and the flag register 380 of the memory interface circuitry 300 of the first embodiment.

Different from the first embodiment, the memory interface circuitry 300a can further include a register module 340, which is coupled to the data pattern generator 330, and the register module 340 receives and stores the plurality of pre-defined data 240. The I/O interface 350 is coupled to the register module 340 and receives the plurality of pre-defined data 240 from the register module 340. The I/O buffer 351 of the I/O interface 350 captures the plurality of data 250 from the plurality of pre-defined data 240 according to the write strobe signal WSS, and the plurality of data 250 are stored into the register module 340. The comparator 360 is coupled to the data pattern generator 330 and the register module 340, the comparator 360 compares the plurality of pre-defined data 240 with the plurality of data 250 to generate the test result 260, and the test result 260 is configured to verify the operation of the I/O interface 350.

In one embodiment, the read register 341 and the write register 342 of the first embodiment are formed to the register module 340 of the third embodiment. In one another embodiment, the comparator 360 can directly obtain the plurality of pre-defined data 240 from the data pattern generator 330, and obtain the plurality of data 250 from the I/O interface 350 without the register module 340. Specifically, the present disclosure is not limited to the amount of storing elements used for temporarily storing the plurality of pre-defined data 240 and the plurality of data 250.

In summary, the present disclosure has the following advantages. First, conducting loopback BIST for testing the I/O interface at high-speed, without using the external test or the evaluation equipment. Second, improving the reliability of the existing I/O looping tester for high-frequency. Third, in the DRAM process, the size of the circuitry can be greatly reduced. Fourth, it is favorable to apply to the memory devices of the address and data bus multiplexing.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A memory interface circuitry, comprising:
a clock generator receiving a first clock signal and converting the first clock signal into a second clock signal;
a state machine coupled to the clock generator and generating a test signal according to the second clock signal;
a data pattern generator coupled to the state machine and generating a data pattern according to the test signal, wherein the data pattern comprises a plurality of pre-defined data;
a read register coupled to the data pattern generator and receiving the plurality of pre-defined data from the data pattern generator, wherein the read register sequentially outputs the plurality of pre-defined data;
an input/output (I/O) interface coupled to the read register and receiving the plurality of pre-defined data from the read register, wherein the I/O interface comprises an I/O buffer, and the I/O buffer captures a plurality of data from the plurality of pre-defined data according to a write strobe signal;
a write register coupled to the I/O interface, wherein the write register receives and stores the plurality of data from the I/O interface; and
a comparator coupled to the data pattern generator and the write register, wherein the comparator compares the plurality of pre-defined data with the plurality of data to generate a test result, and the test result is configured to verify an operation of the I/O interface.

2. The memory interface circuitry of claim 1, wherein the clock generator comprises:
a phase-locked loop (PLL) circuit receiving the first clock signal and filtering the first clock signal to output a reference clock signal; and
a multiplying delay-locked loop (MDLL) circuit coupled to the PLL circuit and converting the reference clock signal into the second clock signal.

3. The memory interface circuitry of claim 1, wherein a first clock frequency of the first clock signal is lower than a second clock frequency of the second clock signal.

4. The memory interface circuitry of claim 1, further comprising:
a delay controlling circuit coupled to the clock generator;
wherein the I/O interface further comprising:
a strobe buffer coupled to the delay controlling circuit and the I/O buffer and generating a data strobe signal, wherein the delay controlling circuit makes the data strobe signal to be the write strobe signal by delaying the data strobe signal, and the strobe buffer transfers the write strobe signal to the I/O buffer.

5. The memory interface circuitry of claim 1, wherein the comparator performs an Exclusive-OR (XOR) operation on the plurality of pre-defined data generated by the data pattern generator and the plurality of data stored in the write register, and respectively compares a plurality of bits of the plurality of pre-defined data with a plurality of bits of the plurality of data.

6. The memory interface circuitry of claim 1, further comprising:
a flag register coupled to the comparator and storing the test result;
wherein in response to determining that the plurality of pre-defined data generated by the data pattern generator is equal to the plurality of data stored in the write register, the test result is a pass flag;
wherein in response to determining that the plurality of pre-defined data generated by the data pattern generator is different from the plurality of data stored in the write register, the test result is a fail flag.

7. A built-in self-testing method for a memory interface circuitry, wherein the memory interface circuitry comprises a clock generator, a state machine, a data pattern generator, a read register, an input/output (I/O) interface, a write register and a comparator, and the built-in self-testing method comprises:

performing a clock signal converting step comprising configuring the clock generator to receive a first clock signal and convert the first clock signal into a second clock signal;

performing a test signal generating step comprising configuring the state machine to generate a test signal according to the second clock signal;

performing a data pattern generating step comprising configuring the data pattern generator to generate a data pattern according to the test signal, wherein the data pattern comprises a plurality of pre-defined data;

performing a data transferring step comprising configuring the read register to receive the plurality of pre-defined data from the data pattern generator and sequentially output the plurality of pre-defined data to the I/O interface, wherein the I/O interface comprises an I/O buffer;

performing a data capturing step comprising configuring the I/O buffer to capture a plurality of data from the plurality of pre-defined data according to a write strobe signal, and then to store the plurality of data in the write register; and performing a data comparing step comprising configuring the comparator to compare the plurality of pre-defined data with the plurality of data to generate a test result, wherein the test result is configured to verify an operation of the I/O interface.

8. The built-in self-testing method of claim 7, wherein the clock generator comprises a phase-locked loop (PLL) circuit and a multiplying delay-locked loop (MDLL) circuit, and the clock signal converting step further comprises:

performing a filtering sub-step to configure the PLL circuit to filter the first clock signal to output a reference clock signal; and performing a converting sub-step to configure the MDLL circuit to convert the reference clock signal into the second clock signal.

9. The built-in self-testing method of claim 7, wherein the memory interface circuitry further comprises a delay controlling circuit, the I/O interface further comprises a strobe buffer, and the data capturing step further comprises:

performing a signal generating sub-step to configure the strobe buffer to generate a data strobe signal;

performing a signal delaying sub-step to configure the delay controlling circuit make the data strobe signal to be the write strobe signal by delaying the data strobe signal; and performing a signal transferring sub-step to configure the strobe buffer to transfer the write strobe signal to the I/O buffer.

10. The built-in self-testing method of claim 7, wherein the memory interface circuitry further comprises a flag register, which stores the test result, in response to determining that the plurality of pre-defined data generated by the data pattern generator is equal to the plurality of data stored in the write register, the test result is a pass flag; and in response to determining that the plurality of pre-defined data generated by the data pattern generator is different from the plurality of data stored in the write register, the test result is a fail flag.

11. A memory interface circuitry, comprising:
a clock generator receiving a first clock signal and converting the first clock signal into a second clock signal;
a state machine coupled to the clock generator and generating a test signal according to the second clock signal;
a data pattern generator coupled to the state machine and generating a data pattern according to the test signal, wherein the data pattern comprises a plurality of pre-defined data;
a register module coupled to the data pattern generator, wherein the register module receives and stores the plurality of pre-defined data;
an input/output (I/O) interface coupled to the register module and receiving the plurality of pre-defined data from the register module, wherein the I/O interface comprises an I/O buffer, the I/O buffer captures a plurality of data from the plurality of pre-defined data according to a write strobe signal, and the plurality of data are stored into the register module; and
a comparator coupled to the data pattern generator and the register module, wherein the comparator compares the plurality of pre-defined data with the plurality of data to generate a test result, and the test result is configured to verify an operation of the I/O interface.

12. The memory interface circuitry of claim 11, wherein the clock generator comprises:
a phase-locked loop (PLL) circuit receiving the first clock signal and filtering the first clock signal to output a reference clock signal; and
a multiplying delay-locked loop (MDLL) circuit coupled to the PLL circuit and converting the reference clock signal into the second clock signal.

13. The memory interface circuitry of claim 11, wherein a first clock frequency of the first clock signal is lower than a second clock frequency of the second clock signal.

14. The memory interface circuitry of claim 11, further comprising:
a delay controlling circuit coupled to the clock generator;
wherein the I/O interface further comprising:
a strobe buffer coupled to the delay controlling circuit and the I/O buffer and generating a data strobe signal, wherein the delay controlling circuit makes the data strobe signal to be the write strobe signal by delaying the data strobe signal, and the strobe buffer transfers the write strobe signal to the I/O buffer.

15. The memory interface circuitry of claim 11, wherein the comparator performs an Exclusive-OR (XOR) operation on the plurality of pre-defined data generated by the data pattern generator and the plurality of data stored in the register module, and respectively compares a plurality of bits of the plurality of pre-defined data with a plurality of bits of the plurality of data.

16. The memory interface circuitry of claim 11, further comprising:
a flag register coupled to the comparator and storing the test result;
wherein in response to determining that the plurality of pre-defined data generated by the data pattern generator is equal to the plurality of data stored in the register module, the test result is a pass flag;
wherein in response to determining that the plurality of pre-defined data generated by the data pattern generator is different from the plurality of data stored in the register module, the test result is a fail flag.

* * * * *